United States Patent
Jing et al.

(10) Patent No.: US 10,680,302 B2
(45) Date of Patent: Jun. 9, 2020

(54) RF FILTER WITH SEPARATE CAPACITIVE AND INDUCTIVE SUBSTRATES

(71) Applicant: CTS Corporation, Lisle, IL (US)

(72) Inventors: Dong Jing, Rio Rancho, NM (US); Reddy Vangala, Albuquerque, NM (US)

(73) Assignee: CTS Corporation, Lisle, IL (US)

( * ) Notice: Subject to any disclaimer, the term of this patent is extended or adjusted under 35 U.S.C. 154(b) by 35 days.

(21) Appl. No.: 15/881,898

(22) Filed: Jan. 29, 2018

(65) Prior Publication Data

US 2018/0226936 A1 Aug. 9, 2018

Related U.S. Application Data

(60) Provisional application No. 62/454,752, filed on Feb. 4, 2017.

(51) Int. Cl.

| H01P 1/203 | (2006.01) |
|---|---|
| H03H 7/01 | (2006.01) |
| H03H 1/00 | (2006.01) |
| H05K 1/02 | (2006.01) |
| H05K 1/14 | (2006.01) |
| H05K 1/11 | (2006.01) |

(52) U.S. Cl.
CPC ......... *H01P 1/2039* (2013.01); *H03H 1/0007* (2013.01); *H03H 7/0115* (2013.01); *H03H 7/0123* (2013.01); *H05K 1/0243* (2013.01); *H05K 1/0284* (2013.01); *H05K 1/111* (2013.01); *H05K 1/144* (2013.01); *H03H 2001/0085* (2013.01)

(58) Field of Classification Search
CPC ........ H01P 1/203; H01P 3/082; H01P 1/2039; H03H 7/0115

USPC ................. 333/175, 185, 204, 206
See application file for complete search history.

(56) References Cited

U.S. PATENT DOCUMENTS 4,703,291 A * 10/1987 Nishikawa ............ H01P 1/2053
333/202
5,731,746 A 3/1998 Sokola et al.
(Continued)

FOREIGN PATENT DOCUMENTS

EP 0566145 A2 10/1993

OTHER PUBLICATIONS

Yoshihiro Konishi, et al: "Newly Proposed Vertically Installed Planar Circuit and its Application." IEEE Transactions on Broadcasting, vol. BC-33, Issue: 1, Mar. 1987, pp. 1-7.

*Primary Examiner* — Rakesh B Patel
(74) *Attorney, Agent, or Firm* — Daniel Deneufbourg

(57) ABSTRACT

An RF filter comprises a first substrate which in one embodiment is a plate including one or more exterior surfaces with a pattern of conductive material defining a plurality of capacitors. A second substrate which in one embodiment is a block includes one or more exterior surfaces with a pattern of conductive material defining a plurality of inductors. The block is seated on the plate in a relationship with the block normal to the plate and the capacitors coupled to the inductors respectively. In one embodiment, the capacitors comprise low impedance open ended capacitive RF signal transmission lines and the inductors comprise high impedance inductive RF signal transmission lines coupled to the low impedance capacitive RF signal transmission lines respectively to define transmission zeros.

11 Claims, 4 Drawing Sheets

(56) References Cited

U.S. PATENT DOCUMENTS

| | | | |
|---|---|---|---|
| 6,255,920 B1* | 7/2001 | Ohwada | H01P 1/2039 333/206 |
| 7,928,816 B2* | 4/2011 | Vangala | H01P 1/205 333/156 |
| 8,344,842 B1 | 1/2013 | Luzanov | |
| 2005/0225408 A1* | 10/2005 | Yagisawa | H01P 1/2013 333/24 C |
| 2009/0189714 A1 | 7/2009 | Sakisaka et al. | |
| 2010/0090781 A1 | 4/2010 | Yamamoto et al. | |
| 2013/0249650 A1 | 9/2013 | Bianchi | |
| 2014/0285944 A1* | 9/2014 | Sato | H01G 4/30 361/277 |
| 2015/0318597 A1* | 11/2015 | Park | H05K 1/0242 333/26 |

* cited by examiner

10,680,302 B2

RF FILTER WITH SEPARATE CAPACITIVE AND INDUCTIVE SUBSTRATES

CROSS-REFERENCE TO RELATED APPLICATIONS

This patent application claims priority and benefit of the filing date of U.S. Provisional Patent Application Ser. No. 62/454,752 filed on Feb. 4, 2017, the disclosure and contents of which are expressly incorporated herein in its entirety by reference.

TECHNICAL FIELD

This invention relates to an RF filter and, more specifically, to a low pass three dimensional RF filter that includes separate capacitive and inductive substrates or blocks coupled together.

BACKGROUND OF THE INVENTION

Waveguide bandpass filters, multimode filters, ceramic monoblock filters and many other types of RF bandpass filters have spurious harmonic passbands close to the fundamental passband that require suppression.

Low pass RF filters available today are of the lumped LC or planar two dimensional (2D) printed circuit board type. Printed circuit low pass filters have relatively higher insertion loss and slow roll off rejection while lumped LC low pass filters including for example chip and wire type LC low pass filters are disadvantageously costly and large because they are composed of discrete LC components and require manual assembly and tuning.

The present invention is directed to a new low cost high performance three dimensional (3D) low pass filter with low insertion loss and fast roll off.

SUMMARY OF THE INVENTION

The present invention is generally directed to an RF filter comprising a first substrate including one or more exterior surfaces with a pattern of conductive material thereon defining first and second RF signal input/output pads and a plurality of capacitors, and a second substrate including a plurality of exterior surfaces with a pattern of conductive material thereon defining a plurality of inductors, the first and second substrates being coupled together in a relationship wherein the capacitors on the first substrate are coupled to the respective inductors on the second substrate.

In one embodiment, the plurality of capacitors on the first substrate are defined by a plurality of low impedance capacitive RF signal transmission lines and the plurality of inductors on the second substrate are defined by a plurality of high impedance inductive RF signal transmission lines coupled to the plurality of low impedance capacitive RF signal transmission lines.

In one embodiment, the plurality of capacitors on the first substrate are defined by a plurality of low impedance capacitive RF signal transmission lines and one or more of the plurality of inductors define an inductive lumped coil element.

In one embodiment, one or more of the capacitors are defined by open ended capacitive RF signal transmission lines which are coupled to respective ones of the plurality of inductors on the second substrate to define one or more transmission zeros.

In one embodiment, the first and second RF signal input/output pads are coupled to respective first and second RF signal input/output transmission lines which are coupled to respective ones of the plurality of capacitors and inductors defined on the first and second substrates respectively.

In one embodiment, the pattern of conductive material on the respective first and second substrates defines respective solder pads for soldering the second substrate to the first substrate.

The present invention is also directed to an RF filter comprising a first substrate including one or more exterior surfaces with a pattern of conductive material defining first and second RF signal input/output transmission lines, and a plurality of low impedance capacitive open ended capacitive RF signal transmission lines coupled to the first and second RF signal input/output transmission lines, and a second substrate including one or more exterior surfaces with a pattern of conductive material defining a plurality of inductive elements, the first and second substrates being coupled together in a relationship wherein the capacitive RF signal transmission lines on the first substrate are coupled to the respective inductive elements on the second substrate and define one or more transmission zeros.

In one embodiment, the plurality of inductive elements define a plurality of high impedance inductive RF signal transmission lines.

In one embodiment, one or more of the plurality of inductive elements define an inductive lumped coil element.

There are other advantages and features of this invention, which will be more readily apparent from the following detailed description of the embodiments of the invention, the drawings, and the appended claims.

BRIEF DESCRIPTION OF THE FIGURES

In the accompanying drawings that form part of the specification, and in which like numerals are employed to designate like parts throughout the same.

DETAILED DESCRIPTION OF THE EMBODIMENTS

Figure 1:
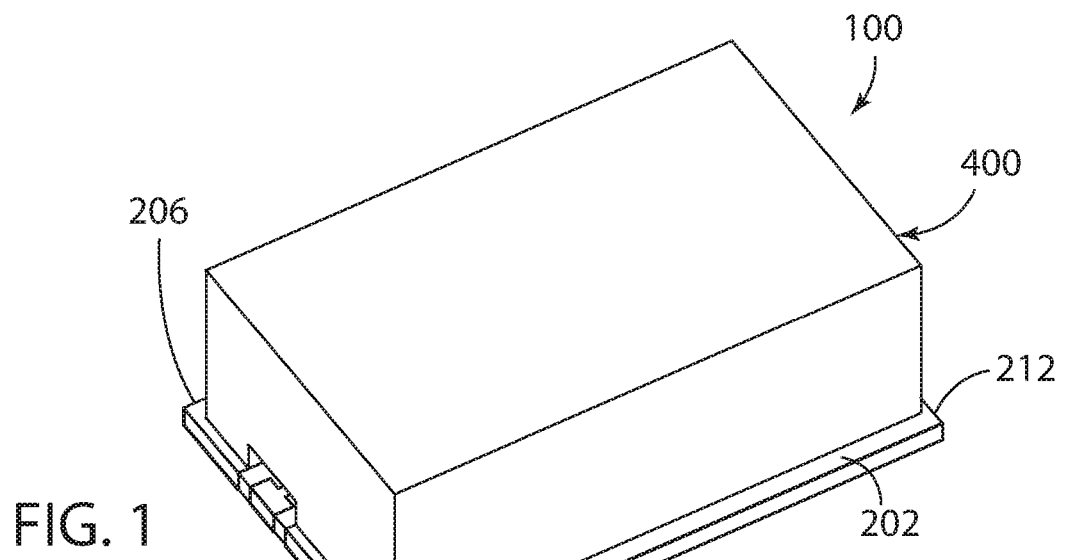
FIG. 1 is a perspective view of an RF filter in accordance with the present invention.

FIGS. 1, 2, 3, 4, 5, and 6 depict a three dimensional (3D) RF filter 100 in accordance with the present invention which, in the embodiment shown, comprises a horizontal capacitive substrate/block/plate 200, a separate vertical inductive substrate/block 300 coupled to the top exterior surface of the horizontal capacitive substrate/block 200 in a relationship normal to the substrate/block/plate 200, and a separate metal lid 400 that covers the substrates/blocks 200 and 300.

In the embodiment shown, the horizontal capacitive substrate/block 200 is in the form of a rectangular solid plate composed of a suitable dielectric ceramic material with low loss, a high dielectric constant, and a low temperature coefficient. The plate includes top and bottom exterior surfaces 202 and 204 respectively, opposed exterior longitudinal side exterior surfaces 206 and 208, and opposed exterior transverse side exterior surfaces 210 and 212.

The top exterior surface 202 of the capacitive substrate/block 200 includes a pattern of conductive material composed of for example copper, silver, or an alloy thereof.

The pattern of conductive material on the top exterior surface 202 defines a plurality of isolated strips or pads of conductive material 214, 216, 218, and 220 which define the respective capacitive elements/capacitors/capacitive RF signal transmission lines of the capacitive substrate/block 200.

In the embodiment shown, the capacitive element/capacitor 214 is an elongate bent and open ended strip of conductive material/RF signal transmission line defined on the top exterior surface 202 that extends from an RF signal input/output strip or trace of conductive material/RF signal transmission line 215 extending from the transverse side exterior surface 210; the capacitive element/capacitor 220 is an elongate bent and open ended strip of conductive material/RF signal transmission line that extends from an RF signal input/output strip or trace of conductive material/RF signal transmission line 221 extending from the opposed transverse side exterior surface 212 in a relationship co-linear with the RF signal input/output strip or trace of conductive material 215; the capacitive element/capacitor 216 is a pad of conductive material defined on the top exterior surface 202 of the substrate 200 and located between and spaced from the capacitive elements 214 and 220; and the capacitive element/capacitor 218 is an elongate bent open ended strip of conductive material/RF signal transmission line defined on the top exterior surface 202 of the substrate 200 and located between and spaced from the capacitive element 216 and the capacitive element 220.

The top exterior surface 202 of the capacitive substrate/block 200 also includes a pair of separate peripheral elongate strips of conductive material 222 and 224 defining respective ground elements. The strip 222 extends along the upper longitudinal side exterior surface 206 and along portions of the opposed transverse side exterior surfaces 210 and 212 and the strip 224 extends along the lower longitudinal side exterior surface 208 and along portions of the opposed transverse side exterior surfaces 210 and 212 in a relationship spaced and opposed to the respective portions of the strip 222 of conductive material extending along the transverse side exterior surfaces 210 and 212.

The top exterior surface 202 of the capacitive substrate/block 200 also includes an elongate strip of conductive material 230 (FIG. 3) defining a solder pad for soldering the substrate/block 300 to the substrate/plate 200.

The bottom exterior surface 204 of the capacitive substrate/block 200 includes a pattern of conductive material defining a pair of isolated RF signal input/output pads 232 and 234 that provide for surface mounting of the RF filter 100 to the respective RF signal input/output pads (not shown) on a mother board (not shown).

The RF signal input/output pads 232 and 234 are coupled electrically to the RF signal input/output traces/RF signal transmission lines 215 and 221 respectively on the top exterior surface 202 of the substrate 200.

Figure 2:
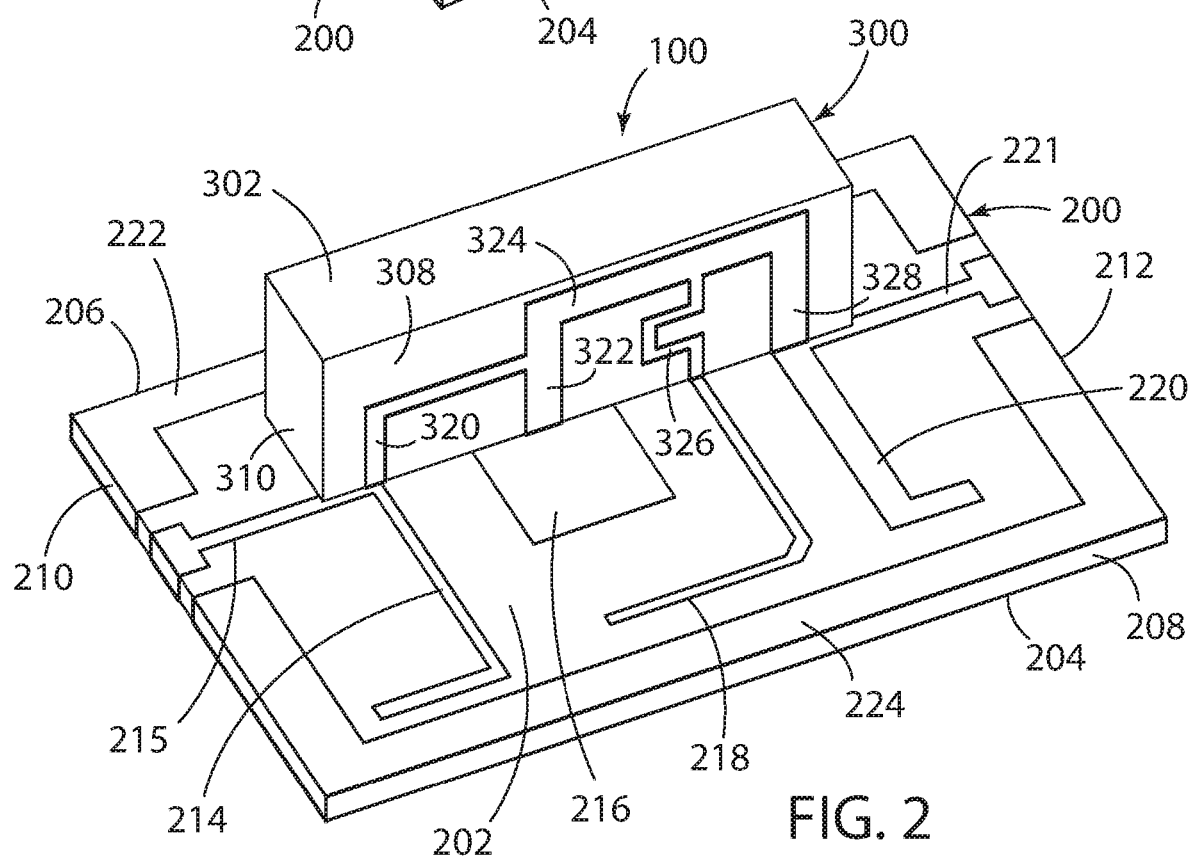
FIG. 2 is an enlarged perspective view of the capacitive and inductive substrates/blocks of the RF filter of the present invention coupled together.
Figure 3:
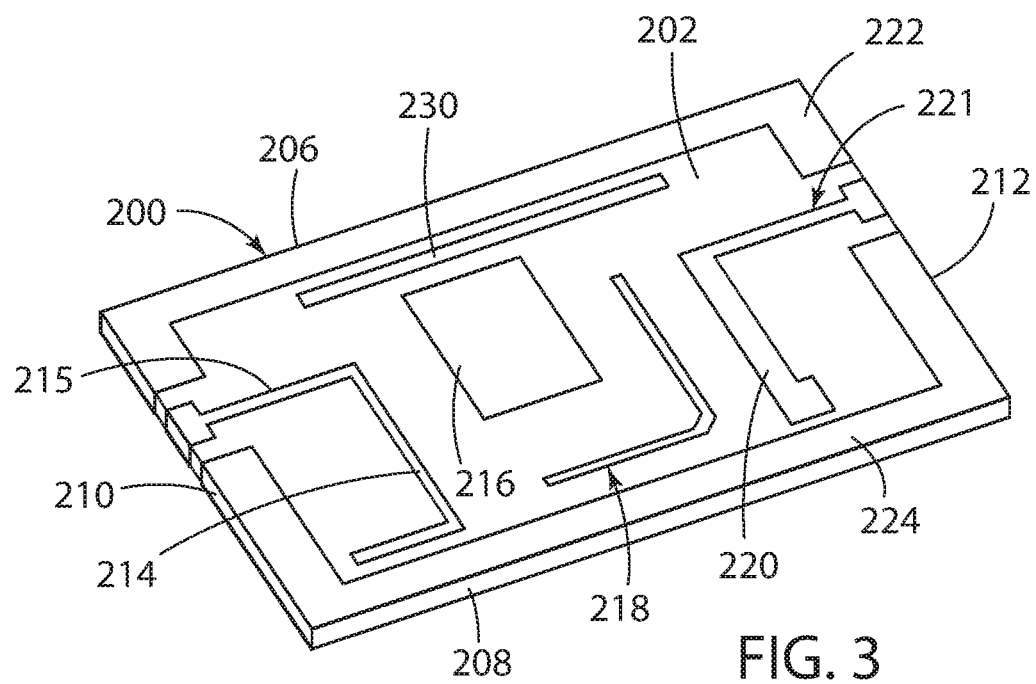
FIG. 3 is a perspective view depicting the capacitive elements on the top exterior surface of the capacitive substrate/block of the RF filter of the present invention.
Figure 4:
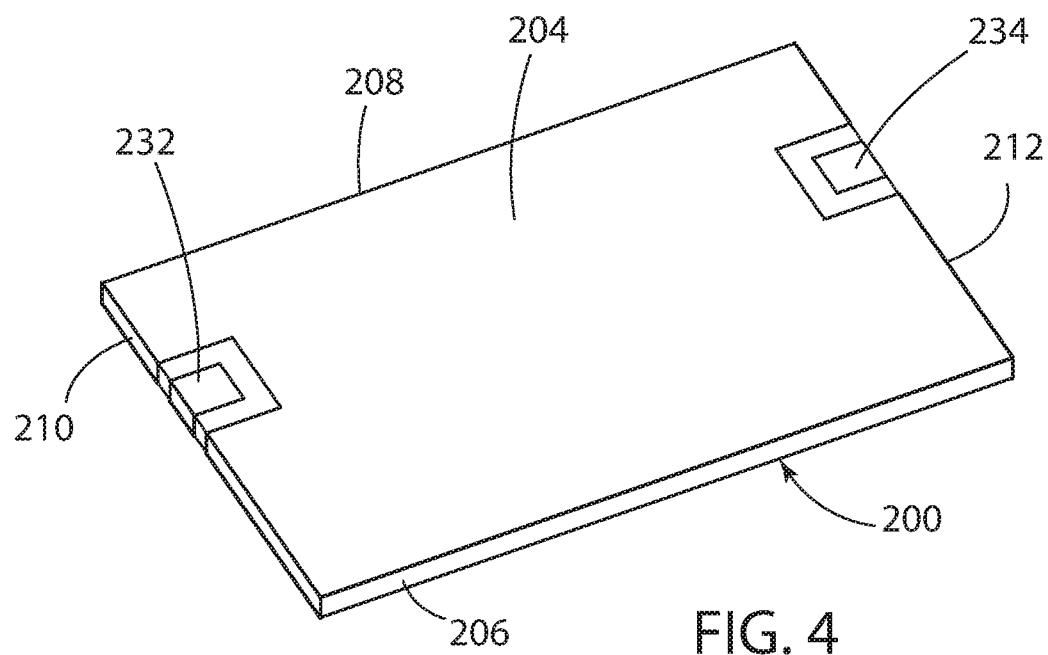
FIG. 4 is perspective view depicting the RF signal input/output pads on the bottom exterior surface of the capacitive substrate/block of the RF filter of the present invention.
Figure 5:
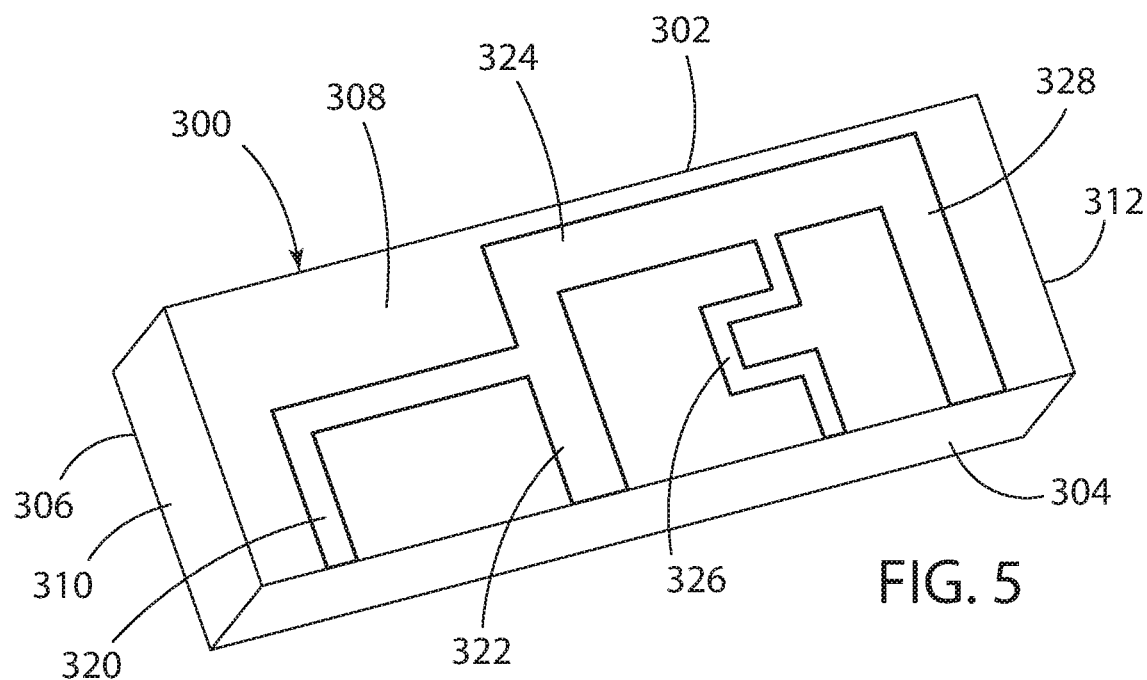
FIG. 5 is a perspective view depicting the inductive elements on the side exterior surface of the vertical inductive substrate/block of the RF filter of the present invention.
Figure 6:
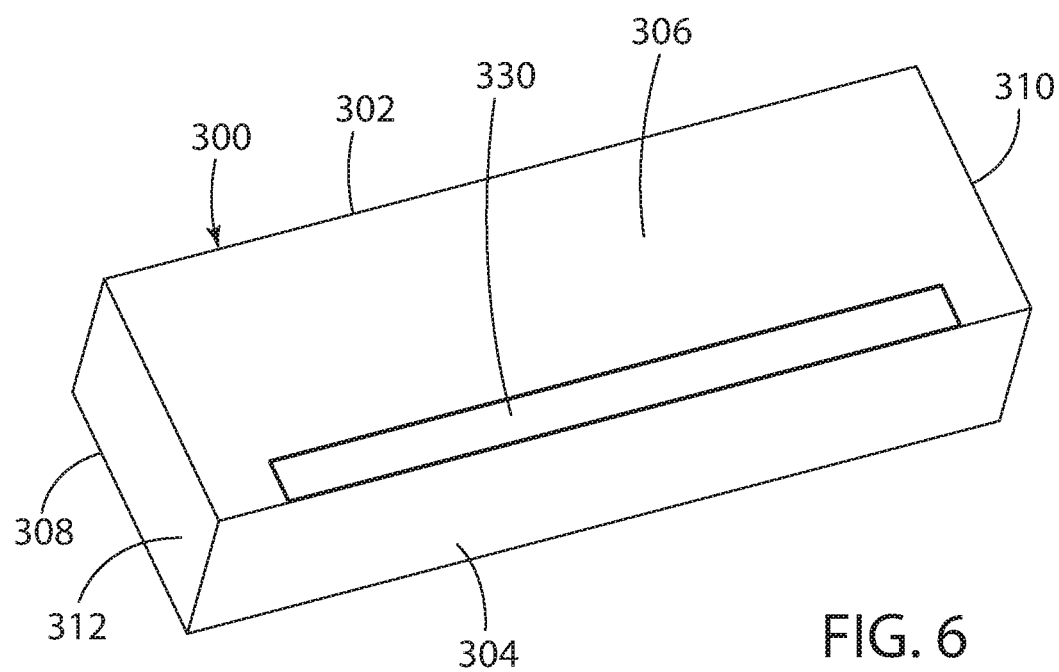
FIG. 6 is a perspective view depicting the soldering element on the opposed side exterior surface of the inductive substrate/block of the RF filter of the present invention.

In the embodiment shown, and referring to FIGS. 2, 5, and 6, the vertical inductive substrate 300 is in the form of a generally parallelepiped shaped solid block of dielectric ceramic material with low loss, a high dielectric constant, and a low temperature coefficient. The substrate/block 300 includes top and bottom exterior surfaces 302 and 304 respectively, opposed exterior longitudinal side exterior surfaces 306 and 308, and opposed exterior transverse side exterior surfaces 310 and 312.

The side exterior surface 308 of the inductive substrate/block 300 includes a pattern of conductive material composed of, for example, copper, silver, or an alloy thereof.

The pattern of conductive material on the side exterior surface 308 defines a plurality of isolated strips of conductive material/RF signal transmission lines 320, 322, 324, 326, and 328 which define the respective high impedance RF signal transmission lines/inductive elements/inductors of the inductive substrate/block 300.

The opposed side exterior surface 306 of the inductive substrate/block 300 includes an elongate longitudinally extending strip of conductive material 330 extending along the lower longitudinal edge of the side exterior surface 306 and defining a solder pad for soldering the substrate/block 300 to the strip of solder 230 on the top exterior surface 202 of the horizontal substrate 200.

In accordance with the present invention, the inductive substrate/block 300 and the separate capacitive substrate/plate 200 are coupled relative to each other in a relationship and orientation in which the substrate/plate 200 is positioned in a generally horizontal relationship and the substrate/block 300 is positioned in a generally vertical relationship and, more specifically, in a relationship in which the blocks/plates 200 and 300 are disposed and oriented in a generally normal or perpendicular relationship to each other.

Still more specifically, the blocks/plates 200 and 300 are disposed and oriented relative to each other in a relationship in which the plate 200 extends in the X and Y directions and the block 300 extends and protrudes outwardly from the top exterior surface 202 of the plate 200 in the X and Z directions so as to define and form a three dimensional (3D) RF signal filter 100 extending in the X, Y, and Z directions.

Still more specifically, the capacitive plate 200 and the inductive block 300 are coupled to each other in relationship wherein: the bottom exterior surface 304 of the substrate/block 300 is seated against the top exterior surface 202 of the substrate/plate 200; the substrate/block 300 is coupled to the substrate/block 200 via soldering of the respective strips 330 and 230 of conductive material on the respective substrate/block 300 and the substrate/plate 200; the respective high impedance inductors/inductive RF signal transmission lines 320, 322, 326, and 328 are aligned and electrically coupled with the respective low impedance capacitors/capacitive RF signal transmission lines 214, 216, 218, and 220; the RF signal input/output transmission line 215 on the substrate/plate 200 is aligned and electrically coupled to the respective inductive and capacitive RF signal transmission lines 320 and 214 on the respective inductive block 300 and the capacitive plate 200; and the other of the RF signal input/output transmission lines 221 on the capacitive substrate/plate 200 is aligned and electrically coupled to the respective inductive and capacitive RF signal transmission lines 328 and 220 on the respective inductive block 300 and the capacitive plate 200.

The capacitive RF signal transmission lines/pads 214, 216, 218, and 220 defined on the capacitive substrate/plate 200 define respective open ended RF signal transmission lines. At the frequency at which the respective RF signal transmission lines become ninety degrees/quarter of wavelength, the open end of the respective capacitive RF signal transmission lines/pads 214 and 220 is equivalent to a short at the connection point and creates a transmission zero.

Before the respective RF signal transmission lines 214, 216, 218, and 220 become ninety degrees, they are capacitors. Therefore, respective capacitive RF signal transmission lines 216 and 218 on the capacitive plate 200 and the respective inductive RF signal transmission lines 322 and 326 on the inductive block 300 form a serial LC circuit which creates a transmission zero before respective capacitive RF signal transmission lines 216 and 218 reach ninety degrees at higher frequencies. This creates transmission zeros much closer to the passband corner frequencies.

The respective inductors/inductive RF signal transmission lines 320, 324, and 328 defined on the inductive block 300 are inductive elements defining the serial inductors of the RF filter 100. The inductance of the RF filter 100 is controlled by the width and the length of the respective inductors/inductive RF signal transmission lines 320, 324, and 328.

Figure 8:
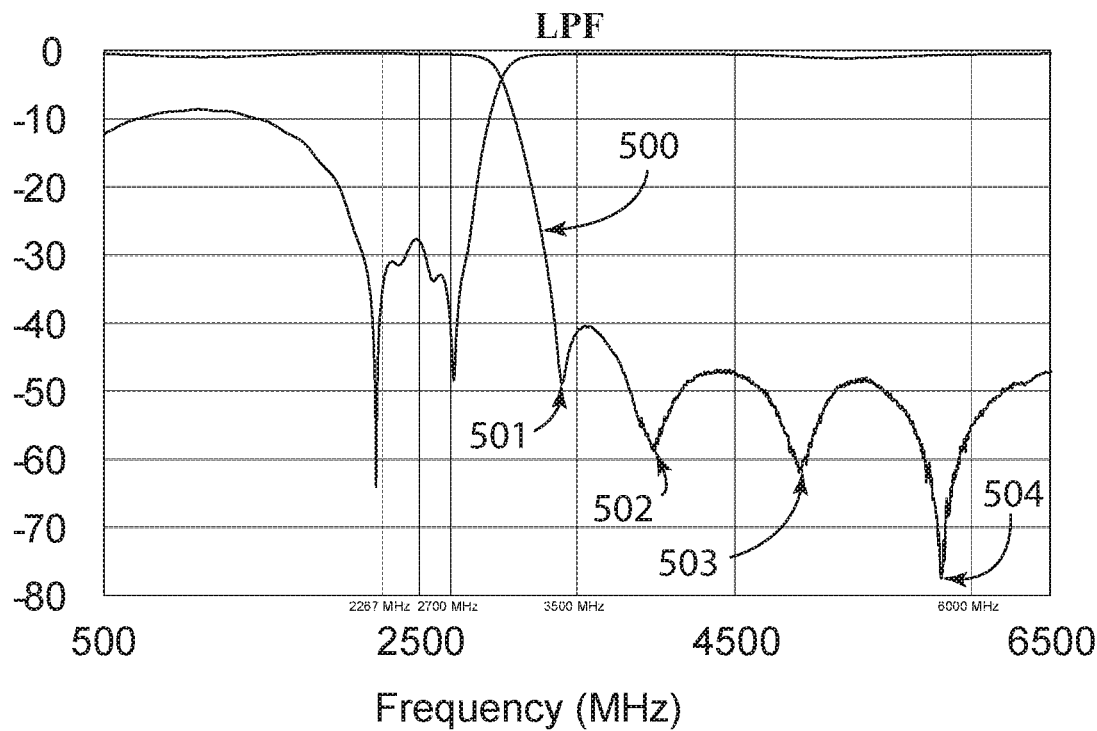
FIG. 8 is a graph depicting the performance of the RF filter of the present invention.

In FIG. 8, the respective null notch points 501, 502, 503, and 504 on the line 500 represent the response of the shunt zero defined by the combination of the following respective coupled capacitive and inductive RF signal transmission lines: 218 with 326; 216 with 322; and 214 with 220.

In accordance with the present invention, the use of an RF filter 100 in which the respective capacitive and inductive RF signal transmission lines/elements are defined/printed on respective separate capacitive and inductive substrates/blocks/plates 200 and 300 which are coupled together during the assembly process advantageously provides and defines an RF filter 100 which can be manufactured more precisely and assembled more quickly and easily.

Figure 7:
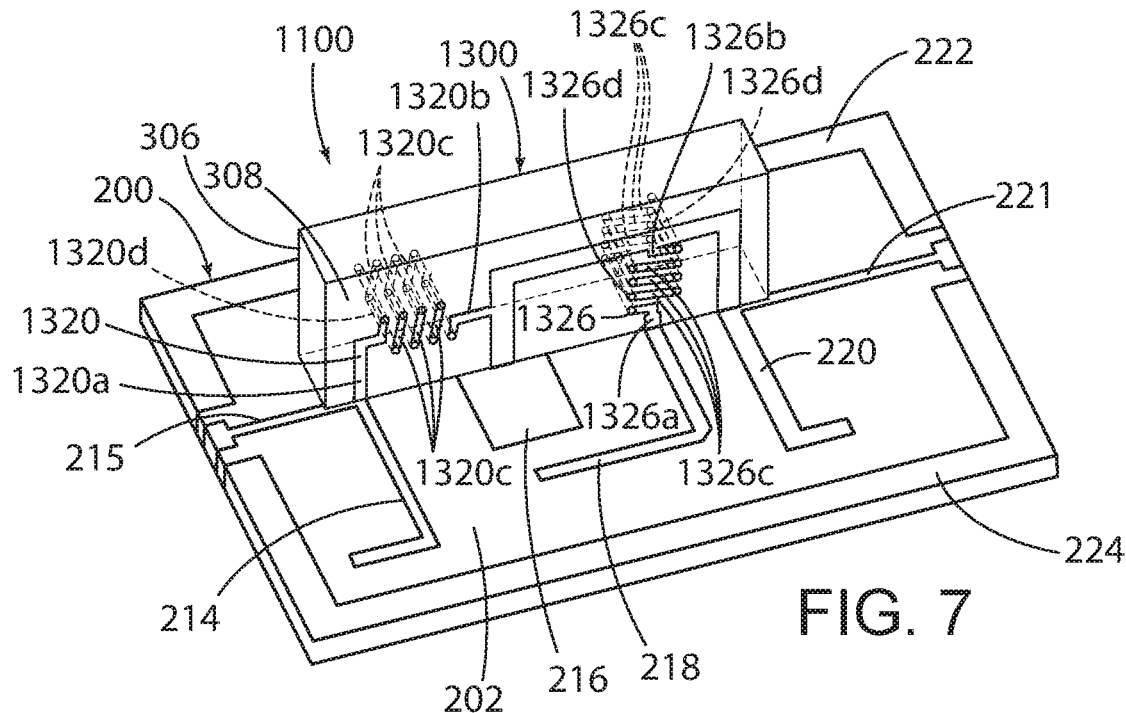
FIG. 7 is a perspective view of the capacitive and inductive substrates/blocks of the RF filter of the present invention including an alternate embodiment of the inductive substrate/block.

FIG. 7 depicts an alternate embodiment of an RF filter 1100 in which the elements thereof corresponding to like elements in the RF filter 100 have been designated with like numerals in FIG. 7 and the earlier description of such elements with respect to the RF filter 100 is incorporated herein by reference with respect to the RF filter 1100.

The RF filter 1100 differs from the RF filter 100 in that the RF filter 1100 includes an alternate inductive substrate/block embodiment 1300 which includes alternate inductive lumped coil elements/RF signal transmission line embodiments 1320 and 1326.

In particular, the alternate inductive lumped coil RF signal transmission line embodiment 1320 includes opposed end strip segments 1320a and 1320b and a plurality of isolated parallel and angled coil segments 1320c located on the side exterior surface 308 between the opposed end strip segments 1320a and 1320b.

A plurality of like coil segments 1320c are located on the opposed side exterior surface 306 and connected to the plurality of coil segments 1320c on the side exterior surface 306 via through-holes 1320d extending through the interior of the block 1100 and terminating in the respective ends of the respective coil segments 1320c.

In a like manner, the alternate inductive lumped coil element/RF signal transmission line embodiment 1326 includes opposed end strip segments 1326a and 1326b and a plurality of isolated, spaced-apart and generally parallel and angled strip coil segments 1326c located on the side exterior surface 308 between the opposed end strip segments 1326a and 1326b.

In a like manner, a plurality of like coil segments 1326c are located on the opposed side exterior surface 306 and connected to the plurality of coil segments 1326c on the side exterior surface 306 via through-holes 1326d extending through the interior of the block 1100 and terminating in the respective ends of the respective coil segments 1326c.

Numerous variations and modifications of the RF filter 100 of the present invention including for example variations and modifications of the capacitive substrate/block/plate 200 and the inductive substrate/block 300 of the present invention may be effected without departing from the spirit and scope of the novel features of the invention.

It is also to be understood that no limitations with respect to the embodiments illustrated herein are intended or should be inferred. It is, of course, intended to cover by the appended claims all such modifications as fall within the scope of the claims.

We claim:

1. An RF filter comprising:
a first substrate including one or more exterior surfaces with a pattern of isolated strips of conductive material on the one or more exterior surfaces of the first substrate defining first and second RF signal input/output pads and a pattern of isolated strips of conductive material on the one or more exterior surfaces of the first substrate defining a plurality of capacitors; and
a second substrate including one or more exterior surfaces with a pattern of isolated strips of conductive material thereon defining a plurality of inductors,
the first and second substrates being coupled together in a relationship wherein the capacitors on the first substrate are directly connected to the respective inductors on the second substrate.

2. An RF filter comprising:
a first substrate including one or more exterior surfaces with a pattern of conductive material thereon defining first and second RF signal input/output pads and a plurality of capacitors; and
a second substrate including one or more exterior surfaces with a pattern of isolated strips of conductive material thereon defining a plurality of inductors,
the first and second substrates being coupled together in a relationship wherein the capacitors on the first substrate are coupled to the respective inductors on the second substrate,
wherein the plurality of capacitors on the first substrate are defined by a plurality of low impedance capacitive RF signal transmission lines and the plurality of inductors on the second substrate are defined by a plurality of high impedance inductive RF signal transmission lines coupled to the plurality of low impedance capacitive RF signal transmission lines.

3. The RF filter of claim 1, wherein the plurality of capacitors on the first substrate are defined by a plurality of low impedance capacitive RF signal transmission lines and one or more of the plurality of inductors define an inductive lumped coil element.

4. The RF filter of claim 1, wherein the first substrate is a plate and the second substrate is a block seated on the plate in a relationship normal to the plate to define a three dimensional RF filter.

5. The RF filter of claim 1, wherein the first and second RF signal input/output pads are coupled to respective first and second RF signal input/output transmission lines which are coupled to respective ones of the plurality of capacitors and inductors defined on the first and second substrates respectively.

6. The RF filter of claim 1, wherein the pattern of conductive material on the respective first and second substrates defines respective solder pads for soldering the second substrate to the first substrate.

7. An RF filter comprising:
a first substrate including one or more exterior surfaces with a pattern of conductive material thereon defining first and second RF signal input/output pads and a plurality of capacitors; and
a second substrate including one or more exterior surfaces with a pattern of conductive material thereon defining a plurality of inductors,
the first and second substrates being coupled together in a relationship wherein the capacitors on the first substrate are coupled to the respective inductors on the second substrate, wherein one or more of the capacitors are defined by open ended capacitive RF signal transmission lines which are coupled to respective ones of the plurality of inductors on the second substrate to define one or more transmission zeros.

8. An RF filter comprising:
a first substrate including one or more exterior surfaces with a pattern of conductive material defining first and second RF signal input/output transmission lines, and a plurality of low impedance capacitive open ended capacitive RF signal transmission lines coupled to the first and second RF signal input/output transmission lines; and
a second substrate including one or more exterior surfaces with a pattern of conductive material defining a plurality of inductive elements;
the first and second substrates being coupled together in a relationship wherein the capacitive RF signal transmission lines on the first substrate are coupled to the respective inductive elements on the second substrate and define one or more transmission zeros.

9. The RF filter of claim 8, wherein the plurality of inductive elements define a plurality of high impedance inductive RF signal transmission lines.

10. The RF filter of claim 8, wherein one or more of the plurality of inductive elements define an inductive lumped coil element.

11. The RF filter of claim 8, wherein the first substrate is a plate and the second substrate is a block seated on the plate in a relationship normal to the plate to define a three dimensional RF filter.

* * * * *